United States Patent [19]

Carlson

[11] Patent Number: 5,304,932
[45] Date of Patent: Apr. 19, 1994

[54] APPARATUS AND METHOD FOR SHIELDING MRI RF ANTENNAE FROM THE EFFECT OF SURROUNDING OBJECTS

[75] Inventor: Joseph W. Carlson, Kensington, Calif.

[73] Assignee: The Regents of the University of California, Oakland, Calif.

[21] Appl. No.: 608,807

[22] Filed: Nov. 5, 1990

[51] Int. Cl.$^5$ .............................. G01V 3/00
[52] U.S. Cl. .................... 324/318; 324/322
[58] Field of Search ........... 324/318, 322, 311, 307, 324/319; 336/84 R, 84 C, 84 M; 505/844

[56] References Cited

U.S. PATENT DOCUMENTS

| | | | |
|---|---|---|---|
| 4,642,569 | 2/1987 | Hayes et al. | 505/844 |
| 4,785,246 | 11/1988 | Sugimoto | 324/318 |
| 4,829,252 | 5/1989 | Kaufman | 324/309 |
| 4,871,969 | 10/1989 | Roemer et al. | 324/318 |
| 4,920,316 | 4/1990 | Egloff | 324/318 |
| 4,980,641 | 12/1990 | Breneman et al. | 324/318 |
| 5,083,085 | 1/1992 | Morad | 324/318 |

*Primary Examiner*—Louis Arana
*Attorney, Agent, or Firm*—Nixon & Vanderhye

[57] ABSTRACT

An MRI RF coil is shielded from extraneous noise sources using an extremely thin conductive shield interposed between the RF coil and the static magnetic structure of an MRI system. To control eddy currents induced in such conductor by the changing magnetic flux of MRI gradient coils, the RF shield conductor thickness is less than three skin depths at the MRI RF operating frequencies of the RF coil. Preferably, the RF shield conductor thickness is on the order of only one skin depth or less.

18 Claims, 1 Drawing Sheet

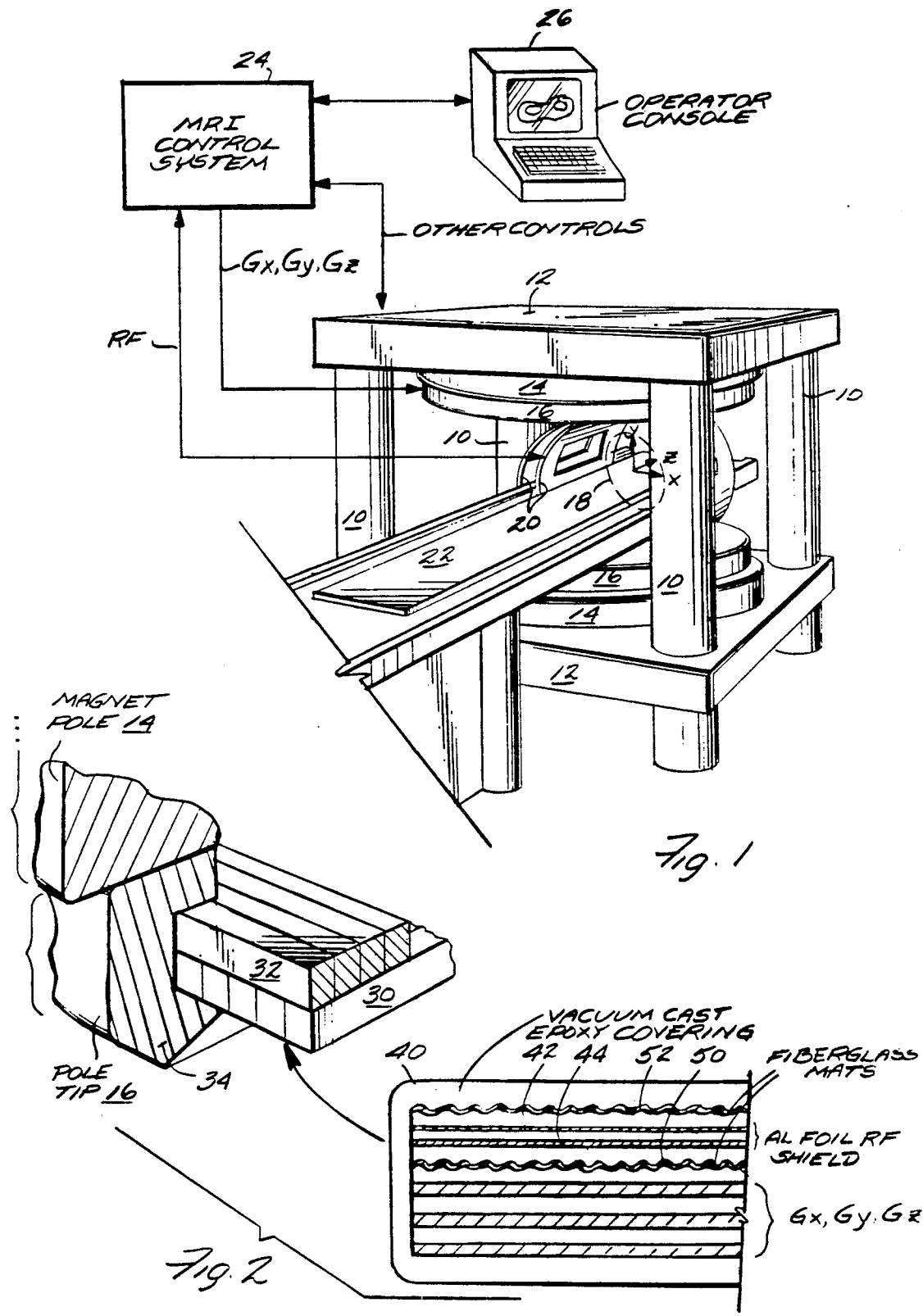

APPARATUS AND METHOD FOR SHIELDING MRI RF ANTENNAE FROM THE EFFECT OF SURROUNDING OBJECTS

BACKGROUND OF THE INVENTION

This invention relates to the field of magnetic resonance imaging (MRI) utilizing nuclear magnetic resonance (NMR) phenomena. It is particularly directed toward the shielding of RF coils in an MRI system from extraneous noise sources.

This patent application is related to commonly assigned issued U.S. Pat. No. 4,829,252—Kaufman and to commonly assigned copending U.S. patent application Ser. No. 07/546,112 filed Jul. 2, 1990 naming Kaufman et al as inventors and entitled "MRI Magnet with Robust Laminated Magnetic Circuit Member and Method of Making Same," now abandoned. The entire contents of this related issued patent and of pending U.S. patent application are hereby incorporated by reference into this application.

MRI systems from many different sources are now well-known and commercially available. Magnetic resonance spectroscopic imaging (MRSI) systems are also known and are hereinafter intended to be included within the terminology "MRI" system.

MRI systems typically include a relatively massive static magnet structure for creating a static magnetic field $B_0$. The static magnet may include a solenoidal cryogenic super-conducting electromagnet or may be of a permanent magnet design. Whatever form of static magnetic is used, it is also typically used in conjunction with a plurality of magnetic gradient coils which are sequentially pulsed to create a sequence of controlled gradients in the static magnetic field during an MRI data gathering sequence. Such controlled sequential gradients are effectuated throughout a patient imaging volume that also is coupled to at least one MRI RF coil. As a part of a typical MRI data gathering sequence, MRI RF signals of suitable frequencies are transmitted into the imaging volume and NMR responsive RF signals are then received from the imaging volume via one or more RF coils or antennae. Information encoded within the frequency and phase parameters of the received RF signals is then processed to form visual images representing the distribution of NMR nuclei within a cross-section or volume of the patient within the imaging volume of the MRI system.

The above-noted related U.S. Pat. No. 4,829,252 describes an MRI system using permanent magnets with open access to the patient image volume and is particularly suited for use in the exemplary embodiment of this invention. To reduce imaging artifacts caused by eddy currents induced in the static magnet structure from changing magnetic flux of the gradient coils, the above-referenced related copending application proposes lamination of the static magnet pole tips. As will be described below, such lamination has been discovered to increase RF noise sources and thus to provide increased need for its shielding from the MRI RF coil(s).

The generation of high quality MRI depends strongly upon the quality of the RF receiving antenna used in the data gathering procedure. There are some RF noise sources inherently present in the process (e.g., within the patient body being imaged) but it is important that care be taken to avoid introduction of any additional unnecessary noise sources into the received RF signals.

Recalling the reciprocity theorem, it will be recognized that one way to assess sources of received RF noise is to measure the power absorbed when the RF antenna is used as a transmitter. Anything which absorbs power in the transmitting mode will also be a source of noise when the same antenna is used as a receiver.

There are three general sources of such power absorption. One is in the antenna itself and that is typically minimized through careful design and use of high quality materials. Another non-avoidable source of noise is in the patient tissues being imaged (albeit surface coils or other techniques can be use for minimized coupling to areas of the patient not actually of image interest). The third category of possible RF power absorption (and therefore a noise source during the RF reception mode) is in the static magnet and/or other structures surrounding the RF coil.

The degree of RF power absorbed in the static magnet or other surrounding structures can be strongly dependent upon the details of magnet design and construction. For example, as above-noted, it has been discovered that adding laminations to the static magnet pole tip (as described in related copending application Ser. No. 07/546,112), now abandoned greatly increases RF power absorption in the static magnet structure.

Generally located closest to the RF receiving antenna is the set of magnetic gradient coils and their associated structure. Although this is a possible source of power loss due to the presence of conducting wires throughout the gradient coil structures, experience has indicated that such losses are typically not an excessive problem.

However, as briefly noted above, experience has now indicated that the static magnet structure itself (typically located outwardly of the gradient coil structures) may be a source of significant power absorption and therefore a source of significant RF noise during the receiving process. For example, when a laminated pole tip structure for the static magnet is used, it has been noted that a receiving coil having a Q of approximately 800 when located outside the magnet may have its Q cut to approximately one-half that value when situated in its operational position between the laminated magnetic pole pieces.

Of course it is well-known in the literature that one can shield an RF antenna from external influences by surrounding the antenna with a good conductor. However, in the context of MRI, such shielding itself produces still further potential imaging artifacts since a conductive surface gives rise to eddy currents generated by changing magnetic flux of the gradient coils (the magnetic field of such eddy currents in turn causing undesirable changes in the magnetic field distribution in the imaging volume). Better conductivity of the shield makes it a better shield—but also causes such eddy currents to take longer to decay to zero and therefore causes greater potential imaging artifact.

The traditional approach to limitation of eddy currents in a conductive member is to create laminations or cuts in the conductor.

SUMMARY OF THE INVENTION

However, we have discovered that better resulting coil Q can be achieved simultaneously with effective RF coil shielding and control of unwanted eddy currents by using an extremely thin sheet of conductive material as the RF shield. If the shielding layer is thin enough, then induced eddy currents from the gradient pulses can be very small while still retaining sufficient RF shielding from extraneous noise sources (e.g., from the laminated static magnet pole tips).

As is well known, the so-called "skin depth" $\delta$ of alternating current signals within a conductor is a function of the conductivity $\sigma$, the magnetic permeability $\mu$, the frequency $\omega$ by the relation:

$$\delta = \sqrt{2/(\mu\sigma\omega)} \quad \text{(Equation 1)}$$

Conventional practice heretofore for RF shield designs is to use a shield conductor thickness which is at least three skin depths (anything thicker than that being substantially unused anyway at the RF frequency of interest since about 97% of all current flows in the first three skin depths).

However, we have discovered that by purposefully making the RF shield conductor thickness less than three skin depths, one can still achieve effective RF shielding for MRI purposes while simultaneously controlling gradient coil eddy current artifacts.

BRIEF DESCRIPTION OF THE DRAWINGS

These as well as other features and advantages of this invention will be better appreciated by careful study of the following detailed description of a presently preferred exemplary embodiment of this invention taken in conjunction with the accompanying drawings of which:

FIG. 1 is a schematic view of an exemplary MRI system having laminated static magnet pole tips in an "open access" type of MRI system and also incorporating an ultra-thin RF shield conductor between the RF coils and the static magnet laminated pole tips; and FIG. 2 is an exploded schematic view of the RF shield and associated structures used in the exemplary embodiment of FIG. 1.

DETAILED DESCRIPTION OF THE PREFERRED EMBODIMENTS

An exemplary MRI system employing this invention is schematically depicted at FIG. 1. Here, the static magnet structure includes massive magnetic circuit components such as pillars 10 sandwiched between members 12 and supporting pole pieces 14 of a permanent magnet structure. Laminated pole tips 16 are disposed above and below the image volume 18 and one or more RF coil structures 20 are RF coupled to the image volume 18 as well. Suitable patient transport mechanism 22 is employed for moving a human patient into and out of the image volume 18 as should be apparent.

The apparatus so far described may typically be located in a shielded room of an MRI facility. In an adjacent control room, the remainder of the MRI control system 24 is typically located with an operator console 26 so as to properly control and operate the entire MR system by causing predetermined sequences of magnetic gradient pulses $G_x$, $G_y$ and $G_z$ as well as RF transmissions and receptions and any other necessary controls so as to collect MRI data, process it and produce visual images (either on the operator console 26 or equivalent digital data which can be transferred to other display units or other media for display or filming).

As depicted in FIG. 2, the pole tip 16 of the exemplary embodiment includes mutually insulated laminations 30, 32 within an annular frame 34. Although the mechanism may not be completely understood at this time, it has been noted that such laminations 30, 32 greatly increase RF noise in the MRI system.

Flat gradient coils $G_x$, $G_y$, $G_z$ are typically encapsulated within a vacuum cast epoxy covering 40 and located within the approximately one meter diameter pole tip area so as to generate the necessary sequence of gradients in the main magnetic field during an MRI sequence. In the exemplary embodiment, a pair of 0.001 inch thick aluminum foil RF shield layers 42, 44 are sandwiched together between fiberglass mats (approximately 1/16 inch thick before compression) 50, 52 and disposed between the magnetic gradient coils and the laminated pole tip within the vacuum cast epoxy covering 40. Although, this positioning of the RF shield members 42, 44 leaves the RF coil structures 20 coupled to the gradient coils, it is presently preferred because it locates the shield member as far away as possible from the RF antenna structures. Since my experience reveals that the gradient coils do not produce significant noise artifact, leaving them coupled to the RF coil (at least in the exemplary embodiment), does not appear to cause any significant problem.

As previously mentioned, with a laminated pole tip structure as in the exemplary embodiment, without any RF shielding the Q of the RF coils was approximately halved when located in the image volume area. However, by including an RF shield between the gradient coils and the laminated pole tip, the Q of the RF coil was only lowered by about 2.5% (e.g., a Q of 800 was reduced to a Q of about 780). Accordingly, the RF shield is effective in substantially decoupling the RF coil from outer extraneous noise sources in the system such as the laminated pole tip of the static magnet structure in the exemplary embodiment.

Although the two sheets of aluminum foil 42, 44 may have some epoxy between them at the edges due to the vacuum cast process, they are assumed to be in substantial electrical contact with one another throughout. Furthermore, although in the exemplary embodiment the RF shield foils 42, 44 are electrically isolated from all other MRI structures, it is believed that such conductive layers could well be electrically grounded within the MR system.

Although the RF shield of the exemplary embodiment does not shield the RF coils from all other MRI structures, it will be appreciated that it does substantially shield the RF coils from the laminated pole tip structures (which appear to be a principal source of Johnson noise during the RF reception process in this particular exemplary embodiment).

At the RF frequencies used in the exemplary embodiment (e.g., approximately 2.7 megahertz), the skin depth thickness in copper is approximately 0.0015 inch. I have found that copper sheets of conventional thickness (e.g., more than three skin depths) produces unacceptably large eddy current MRI artifacts. However, I have also discovered that using a material substantially less than even one skin depth thick still maintains essentially fully effective RF screening while simultaneously having sufficiently reduced conductivity for induced gradient field eddy currents so as to effectively suppress artifact from this source.

Based on present tests, it appears that an RF screen approximately 0.5 to 0.75 skin depth thickness provides an effective RF screen while producing gradient pulsed induced eddy currents which persist for only approximately one millisecond. Since any currents with such relatively fast decay times are not typically too serious a hindrance to MRI, this has been found to provide an acceptable compromise.

In the exemplary embodiment, aluminum foil is used. Since a commercially available foil thickness is 0.001 inch, and since the skin depth at 2.7 megahertz in aluminum is on the order of 0.002 inch, two sheets of such foil are used.

While only one exemplary embodiment of this invention has been described in detail, those skilled in the art will recognize that many variations and modifications of this embodiment may be made while still retaining many of the novel features and advantages of this invention. Accordingly, all such variations and modifications are intended to be included within the scope of the appended claims.

What is claimed is:

1. In an MRI system having a static magnet and a set of gradient magnetic coils used to create a sequence of controlled MRI magnetic fields within an MRI imaging volume that is coupled to at least one MRI RF coil, the improvement comprising:
    an RF shield interposed between said RF coil and said static magnet, said shield including a conductive layer of thickness less than three skin depths at the MRI RF operating frequencies of said RF coil thereby shielding the RF coil from the static magnet while also limiting eddy currents induced in the shield by the gradient magnetic coils.

2. An MRI system as in claim 1 wherein said RF shield is electrically insulated from all other structures in the MRI system.

3. An MRI system as in claim 1 wherein said conductive layer is a continuous metal film.

4. In an MRI system having a static magnet and a set of gradient magnetic coils used to create a sequence of controlled MRI magnetic fields within an MRI imaging volume that is coupled to at least one MRI RF coil, the improvement comprising:
    an RF shield interposed between said RF coil and said static magnet, said shield including a conductive layer of thickness less than three skin depths at the MRI RF operating frequencies of said RF coil thereby shielding the RF coil from the static magnet while also limiting eddy currents induced in the shield by the gradient magnetic coils, and
    wherein said RF shield comprises a plurality of conductive layers, each layer being of thickness less than one skin depth at the MRI operating frequencies of said RF coil.

5. In an MRI system having a static magnet and a set of gradient magnetic coils used to create a sequence of controlled MRI magnetic fields within an MRI imaging volume that is coupled to at least one MRI RF coil, the improvement comprising:
    an RF shield interposed between said RF coil and said static magnet, said shield including a conductive layer of thickness less than three skin depths at the MRI RF operating frequencies of said RF coil thereby shielding the RF coil from the static magnet while also limiting eddy currents induced in the shield by the gradient magnetic coils, and
    wherein said RF shield is interposed between said static magnet and said set of gradient magnetic coils.

6. In an MRI system having a static magnet and a set of gradient magnetic coils used to create a sequence of controlled MRI magnetic fields within an MRI imaging volume that is coupled to at least one MRI RF coil, the improvement comprising:
    an RF shield interposed between said RF coil and said static magnet, said shield including a conductive layer of thickness less than three skin depths at the MRI RF operating frequencies of said RF coil thereby shielding the RF coil from the static magnet while also limiting eddy currents induced in the shield by the gradient magnetic coils, and
    wherein said static magnet includes laminated pole tips to reduce eddy currents induced therein by the gradient magnetic coils.

7. In an MRI system having a static magnet and a set of gradient magnetic coils used to create a sequence of controlled MRI magnetic fields within an MRI imaging volume that is coupled to at least one MRI RF coil, the improvement comprising:
    an RF shield interposed between said RF coil and said static magnet, said shield including a conductive layer of thickness less than three skin depths at the MRI RF operating frequencies of said RF coil thereby shielding the RF coil from the static magnet while also limiting eddy currents induced in the shield by the gradient magnetic coils, and
    wherein said shield comprises a pair of 0.001 inch thick aluminum foils sandwiched together between fiberglass mats in a cast epoxy covering.

8. In an MRI system having a static magnet and a set of gradient magnetic coils used to create a sequence of controlled MRI magnetic fields within an MRI imaging volume that is coupled to at least one MRI RF coil, the improvement comprising:
    an RF shield interposed between said RF coil and said static magnet, said shield including a conductive layer of thickness less than three skin depths at the MRI RF operating frequencies of said RF coil thereby shielding the RF coil from the static magnet while also limiting eddy currents induced in the shield by the gradient magnetic coils, and
    wherein said shield comprises a pair of 0.001 inch thick aluminum foils sandwiched together between fiberglass mats in a cast epoxy covering.

9. AN MRI structure as in claim 8 wherein said gradient magnetic coils, mutually insulated from one another, are also included within said cast epoxy covering.

10. A method for shielding an MRI RF coil in an MRI system having a static magnet and a set of gradient magnetic coils used to create a sequence of controlled MRI magnetic fields within an MRI imaging volume that is coupled to at least one MRI RF coil, the method comprising:
    interposing an RF shield between said RF coil and said static magnet, said shield including a conductive layer of thickness less than three skin depths at the MRI operating frequencies of said RF coil thereby shielding the RF coil from the static magnet while also limiting eddy currents induced in the shield by the gradient magnetic coils.

11. A method as in claim 10 wherein said RF shield is electrically insulated from all other structures in the MRI system.

12. A method as in claim 10 wherein said conductive layer is a continuous metal film.

13. A method for shielding an MRI RF coil in an MRI system having a static magnet and a set of gradient magnetic coils used to create a sequence of controlled MRI magnetic fields within an MRI imaging volume that is coupled to at least one MRI RF coil, the method comprising:

interposing an RF shield between said RF coil and said static magnet, said shield including a conductive layer of thickness less than three skin depths at the MRI operating frequencies of said RF coil thereby shielding the RF coil from the static magnet while also limiting eddy currents induced in the shield by the gradient magnetic coils, and wherein said RF shield comprises a plurality of conductive layers, each layer being of thickness than one skin depth at the MRI operating frequencies of said RF coil.

14. A method for shielding an MRI RF coil in an MRI system having a static magnet and a set of gradient magnetic coils used to create a sequence of controlled MRI magnetic fields within an MRI imaging volume that is coupled to at least one MRI RF coil, the method comprising:

interposing an RF shield between said RF coil and said static magnet, said shield including a conductive layer of thickness less than three skin depths at the MRI operating frequencies of said RF coil thereby shielding the RF coil from the static magnet while also limiting eddy currents induced in the shield by the gradient magnetic coils, and wherein said RF shield is interposed between said static magnet and said set of gradient magnetic coils.

15. A method for shielding an MRI RF coil in an MRI system having a static magnet and a set of gradient magnetic coils used to create a sequence of controlled MRI magnetic fields within an MRI imaging volume that is coupled to at least one MRI RF coil, the method comprising:

interposing an RF shield between said RF coil and said static magnet, said shield including a conductive layer of thickness less than three skin depths at the MRI operating frequencies of said RF coil thereby shielding the RF coil from the static magnet while also limiting eddy currents induced in the shield by the gradient magnetic coils, and wherein said static magnet includes laminated pole tips to reduce eddy currents induced therein by the gradient magnetic coils.

16. A method for shielding an MRI RF coil in an MRI system having a static magnet and a set of gradient magnetic coils used to create a sequence of controlled MRI magnetic fields within an MRI imaging volume that is coupled to at least one MRI RF coil, the method comprising:

interposing an RF shield between said RF coil and said static magnet, said shield including a conductive layer of thickness less than three skin depths at the MRI operating frequencies of said RF coil thereby shielding the RF coil from the static magnet while also limiting eddy currents induced in the shield by the gradient magnetic coils, and wherein said RF shield comprises a conductive layer of thickness less than one skin depth at the MRI operating frequencies of said RF coil.

17. A method for shielding an MRI RF coil in an MRI system having a static magnet and a set of gradient magnetic coils used to create a sequence of controlled MRI magnetic fields within an MRI imaging volume that is coupled to at least one MRI RF coil, the method comprising:

interposing an RF shield between said RF coil and said static magnet, said shield including a conductive layer of thickness less than three skin depths at the MRI operating frequencies of said RF coil thereby shielding the RF coil from the static magnet while also limiting eddy currents induced in the shield by the gradient magnetic coils, and wherein said shield comprises a pair of 0.001 inch thick aluminum foils sandwiched together between fiberglass mats in a cast epoxy covering.

18. A method as in claim 17 wherein said gradient magnetic coils, mutually insulated from one another, are also included within said cast epoxy covering.

* * * * *